United States Patent
Lee et al.

(10) Patent No.: US 7,094,649 B2
(45) Date of Patent: Aug. 22, 2006

(54) METHOD FOR FORMING MULTI-LEVEL MASK ROM CELL AND NAND MULTI-LEVEL MASK ROM

(75) Inventors: Chien-Hsing Lee, Jhubei (TW);
Chin-Hsi Lin, Hsinchu (TW);
Jhyy-Cheng Liou, Jhubei (TW)

(73) Assignee: Solid State System Co., Ltd., Hsinchu (TW)

( * ) Notice: Subject to any disclaimer, the term of this patent is extended or adjusted under 35 U.S.C. 154(b) by 163 days.

(21) Appl. No.: 10/886,981

(22) Filed: Jul. 7, 2004

(65) Prior Publication Data

US 2005/0170588 A1   Aug. 4, 2005

Related U.S. Application Data

(60) Provisional application No. 60/541,872, filed on Feb. 3, 2004.

(51) Int. Cl.
*H01L 21/8236* (2006.01)
(52) U.S. Cl. .............................. 438/278; 257/E21.671
(58) Field of Classification Search ............... 438/130, 438/277, 278; 257/E21.671, E21.678
See application file for complete search history.

(56) References Cited

U.S. PATENT DOCUMENTS 5,691,216 A * 11/1997 Yen et al. .................... 438/278
6,180,463 B1 * 1/2001 Otsuki ......................... 438/278
6,734,064 B1 * 5/2004 Yang et al. .................. 438/278

* cited by examiner

*Primary Examiner*—Chandra Chaudhari
(74) *Attorney, Agent, or Firm*—J.C. Patents (57) ABSTRACT

The present invention relates to a multi-level read only memory cell that can store two bits and the fabrication method thereof. The multi-level ROM cell has the storage capacity of two bits and the resultant NAND type ROM memory array can provide four logic states of two bits, thus increasing the data storage capacity.

30 Claims, 12 Drawing Sheets

METHOD FOR FORMING MULTI-LEVEL MASK ROM CELL AND NAND MULTI-LEVEL MASK ROM

CROSS-REFERENCE TO RELATED APPLICATION

This application claims the priority benefits of U.S. provisional application titled "MULTI-LEVEL NAND MASK PROGRAMMABLE ROM" filed on Feb. 3, 2004, Ser. No. 60/541,872. All disclosure of this application is incorporated herein by reference.

BACKGROUND OF THE INVENTION

1. Field of Invention

The present invention relates to a mask read only memory cell. More particularly, the present invention relates to a method for forming a multi-level mask read only memory and a multi-level mask read only memory.

2. Description of Related Art

Generally, the mask read only memory (ROM) can be divided as NOR type mask ROM and NAND type mask ROM. Although the NOR type mask ROM usually affords larger cell currents, the fabrication processes are more complicated. On the other hand, the NAND type Mask ROM can provide dense cell sizes and employ fabrication processes compatible with the standard Logic processes.

In general, the structure of the mask ROM includes a plurality of bit lines and a plurality of polysilicon word lines bridging over the bit lines. Channel regions of the memory cells are beneath the word lines and between two neighboring bit lines. The mask ROM cells can be programmed to store data. For the NAND type mask ROM cell programming, the stored logic data is either "0" or "1" depending on whether the ions are implanted into the channel regions or not. Such implantation process, implanting ions or dopants into the specific channel regions, is so called code implantation process.

The NAND type ROM memory consists of series MOS transistors, including depletion mode MOS transistors and enhancement mode MOS transistors. Providing the intrinsic MOS transistor is the enhancement mode NMOS transistor and the threshold voltage is positive, the ROM code implantation implants impurities into the channel region of the depletion mode NMOS transistor and changes its threshold voltage to be negative. In general, for the conventional mask ROM, each memory cell can be programmed to store only one bit data (i.e. either "0" or "1") at one time.

However, as high performance ROM memory is highly demanded and the chip size keeps decreasing, it is desirable to increase the storage capacity of the ROM memory cell.

SUMMARY OF THE INVENTION

The present invention provides a method of fabricating a multi-level mask ROM structure by performing twice ROM code implantation, which is compatible with the conventional mask ROM fabrication process.

As embodied and broadly described herein, the fabrication method of this invention comprises performing a threshold voltage implantation for adjusting the intrinsic memory cell to be subsequently either an enhancement mode transistor or a depletion mode transistor. Afterwards, a first code implantation is performed to the memory region so as to obtain memory cells with a first threshold voltage range and memory cells with a second threshold voltage range. Next, a second code implantation is performed to the memory region so as to obtain memory cells with a third threshold voltage range and memory cells with a fourth threshold voltage range, except for the memory cells with the first threshold voltage range and the second threshold voltage range. Therefore, the resultant mask ROM array can provide multiple levels of threshold distribution corresponding for logic states.

The invention provides a multi-level mask ROM structure. The multi-level mask ROM array of this invention can provide multiple levels of threshold distribution for logic data, while each of the memory cells of the multi-level mask ROM structure can store two bits, thus efficiently increasing the storage capacity of the mask ROM.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the present invention, a multi-level mask programmable ROM, of which one memory cell can store two bits data, is provided. Each of the memory cells has the storage capability of two bits by employing twice ROM code implantation. For the multi-level ROM memory cell in the present invention, "bit 1" and "bit 2" are used to depict the data status of the two bits stored in each ROM memory cell, and "code-1" and "code-2" implantation are used to depict the first and the second code implantation. The mask ROM cell of this invention preferably is applied for NAND type mask ROM.

Figure 1:
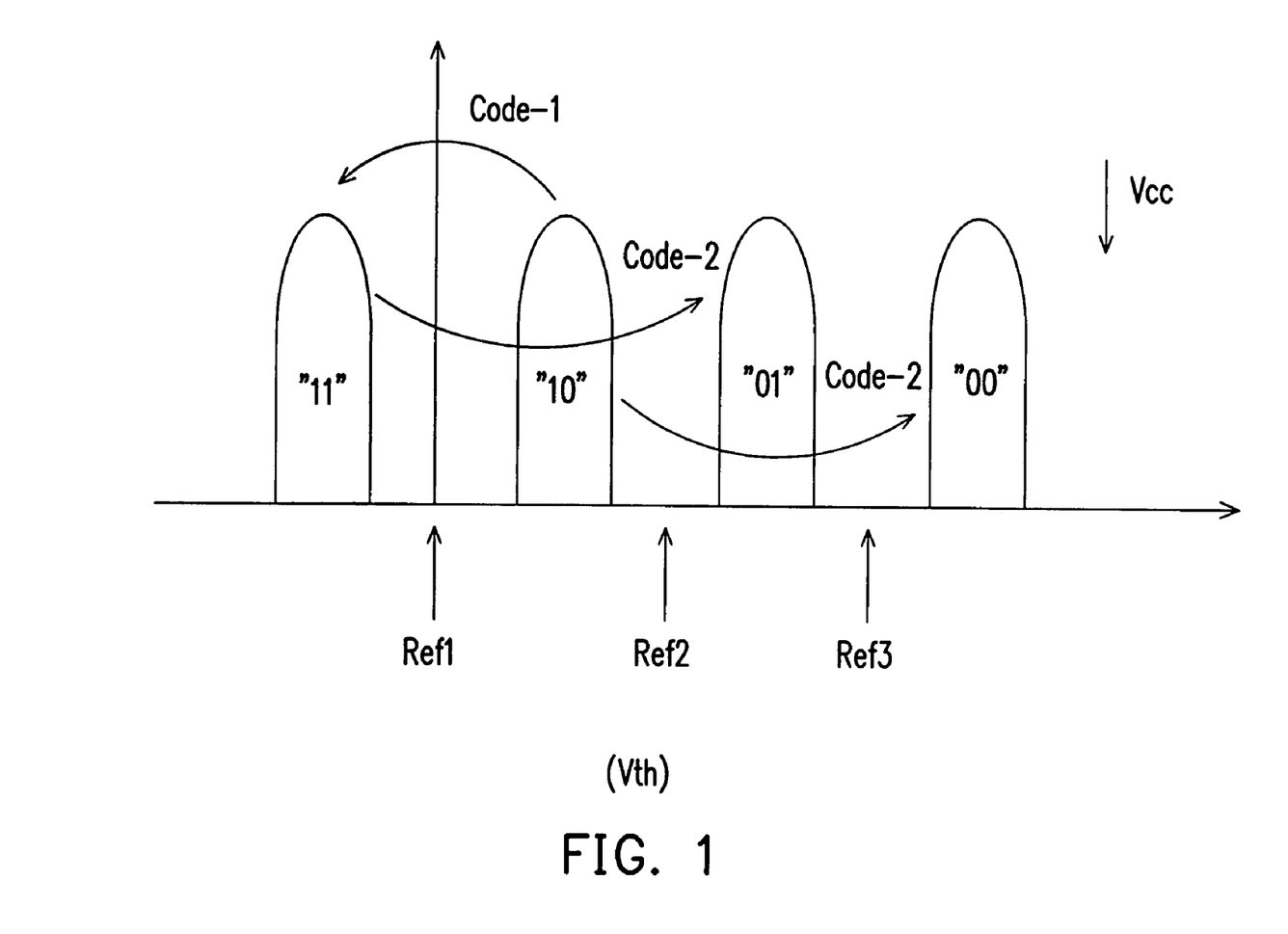
FIG. 1 is a schematic view showing the cell threshold voltage distribution of the ROM memory cell according to one preferred embodiment.

According to one preferred embodiment, FIG. 1 is a schematic view showing the cell threshold voltage distribution of the ROM memory cell as the code implantation is applied to form a multi-level ROM cell. According to this preferred embodiment, the intrinsic memory cell is an enhancement mode transistor, for example, a NMOS transistor in P-type substrate having the threshold voltage (Vt) larger than 0. For the memory cell, the "1" logic state of bit 1 stands for "yes" of the code-1 implantation (with impurities implanted to the cell), while the "0" logic state of bit 1 stands for "no" of the code-1 implantation (without impurities implanted to the cell), as shown in Table 1.

TABLE 1

Code-1, Code-2 implantation for the multi-level ROM cell (2 bits/cell).

| | Implantation | Bit 2 (state) | Bit 1 (state) |
|---|---|---|---|
| Code-1 | Y | — | 1 |
| | N | — | 0 |
| Code-2 | Y | 0 | — |
| | N | 1 | — |

The "1" state of bit 1 for the memory cell can be achieved by performing the first code (code-1) implantation, for example, implanting N-type impurities to the channel region, so that Vt of the memory cell is shift to a negative value. On the other hand, the memory cell without impurities implanted ("0" state of bit 1) still has Vt>0. In this case, the "0" logic state of bit 2 stands for "yes" of the code-2 implantation (with impurities implanted to the cell), while the "1" logic state of bit 2 stands for "no" of the code-2 implantation (without impurities implanted to the cell), as shown in Table 1. For example, the "0" state of bit 2 for the memory cell can be achieved by performing the second code (code-2) implantation, for example, implanting P-type impurities to the channel region, so that Vt of the memory cell shift to a positive value. As shown in FIG. 1, four sets of cell threshold distribution represent 4 logic states "11", "10", "01" and "00" of 2 bits in the ROM memory array. Therefore, the mask read only memory array of this invention has multiple levels of threshold voltage distributions and can provide up to four logic states for data storage.

According to this embodiment, the code-1 implantation results in the memory cells with higher Vt (larger than 0 or Ref-1) and the memory cells with lower Vt (smaller than 0 or Ref-1). Then after the code-2 implantation, the memory cells with higher Vt that are implanted with code-2 impurities shift to even a higher Vt (higher than Ref-3), representing by the logic state "00", while the memory cells with lower Vt that are implanted with code-2 impurities shift to a higher Vt (higher than Ref-2), representing by the logic state "01". Similarly, after the code-2 implantation, the code-2-undoped memory cells with higher Vt and the code-2-undoped memory cells with lower Vt are respectively represented by the logic states "10" and "11". Ref-1, Ref-2 and Ref-3 are reference word line voltages to distinguish four logic states of the multi-level memory cell.

Figure 2A:
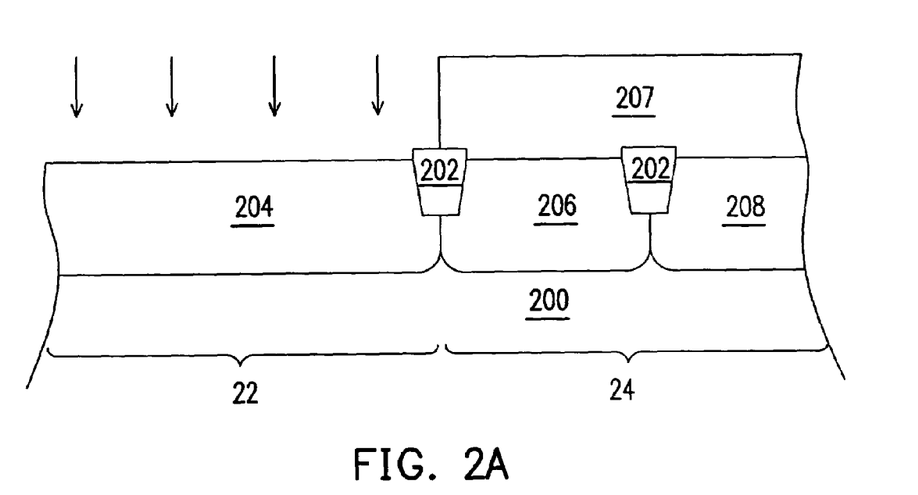
FIGS. 2A–2H are schematic cross-sectional views of process steps for forming the multilevel ROM memory cell according to one preferred embodiment of the present invention.

FIGS. 2A–2H are schematic cross-sectional views of process steps for forming the multilevel NAND ROM memory cell according to one preferred embodiment of the present invention. In FIG. 2A, a substrate 200 having a plurality of isolation structures 202 is provided. The substrate 200 can be P-type substrate, and the isolation structure can be a shallow trench isolation (STI) structure, for example. The substrate 200 includes at least a memory region 22 and a periphery region 24. After well implantation and thermal treatment under 950–1100° C., a plurality of N-type wells (N-wells) and a plurality of P-type wells (P-wells) are formed in the substrate 200. The memory region 22 includes at least a P-type well 204, while the periphery region 24 includes at least a N-type well 206 and a P-type well 208. Then, after applying the first patterned photoresist layer 207 as a mask, P-type impurities are implanted (cell Vt implantation) to adjust the memory cell threshold voltage (Vt) in the memory region, so that the memory cell subsequently becomes the enhancement mode NMOS transistor. In addition, P-type impurities can be implanted through the isolation structures as "channel stopper" to improve cell field isolation. Afterwards, the first patterned photoresist layer 207 is removed.

Figure 2B:
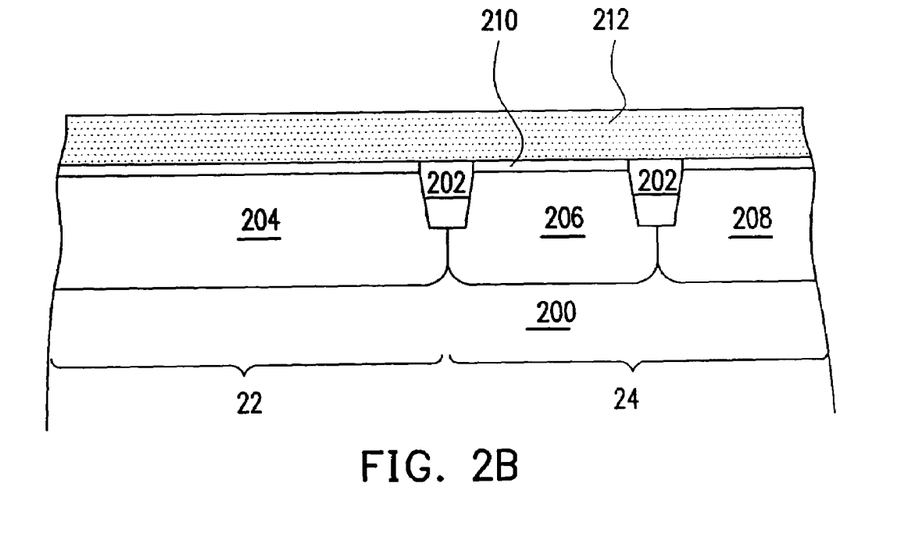

Referring to FIG. 2B, a gate oxide layer 210 and a gate conductive layer 212 are sequentially formed on the substrate 200. The gate conductive layer is, for example an undoped polysilicon layer having a thickness of about 2000–4000 Angstroms. If the gate conductive layer is an undoped polysilicon layer, N-type impurities are implanted into the undoped gate conductive layer above the P-wells, and P-type impurities are then implanted into the undoped gate conductive layer above the N-wells, by using different patterned photoresist masks. Alternatively, the gate conductive layer 212 can be a doped polysilicon layer formed by in-situ doping, for example.

Figure 2C:
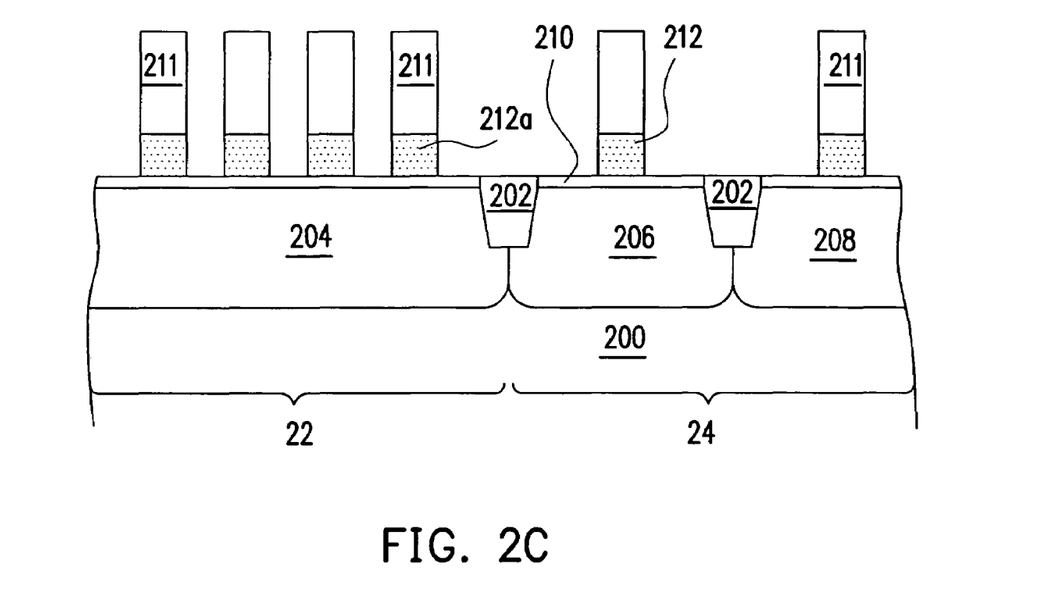

In FIG. 2C, after applying the second patterned photoresist layer 211 as a mask, the gate conductive layer 212 is patterned by, for example, performing dry etching. The patterned gate conductive layer 212a acts as word line(s) of the NAND type ROM cell.

Figure 2D:
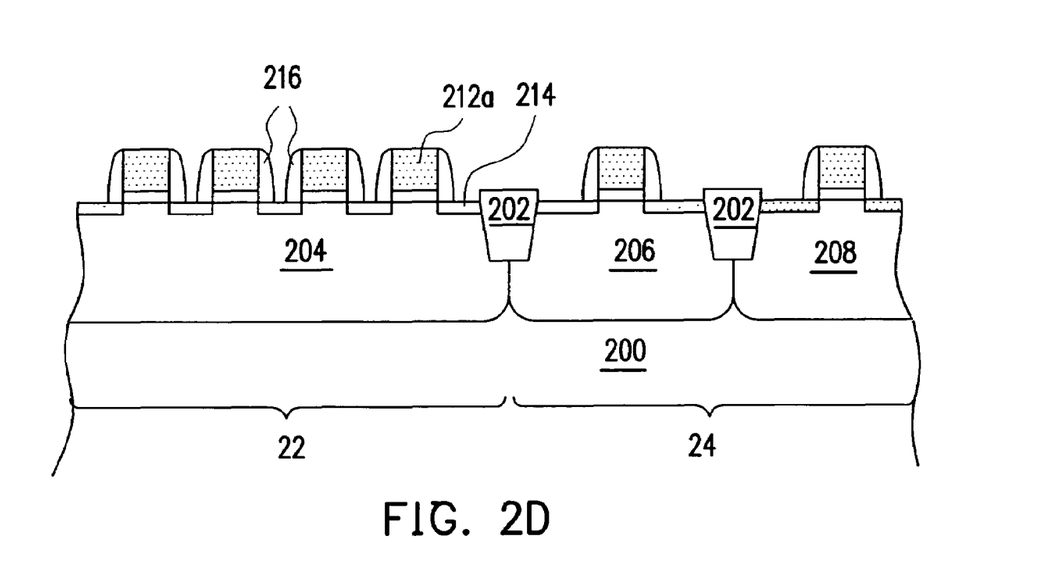

Referring to FIG. 2D, using the patterned gate conductive layer 212a as a mask, LDD implantation is performed to form LDD regions 214 in the substrate 200 along both sides of the patterned gate conductive layer 212a. For example, N-type LDD impurities are implanted into the P-wells using the N-doped gate conductive layer as masks and with the N-well covered, and P-type LDD impurities are later implanted into the N-well using the P-doped gate conductive layer as mask and with the P-wells covered. Afterwards, spacers 216 are formed on the sidewalls of the patterned gate conductive layer 212a, by, for example, blanketly forming a silicon oxide layer or a silicon nitride layer or both (not shown) covering the substrate and then etching back until the gate conductive layer is exposed.

Figure 2E:
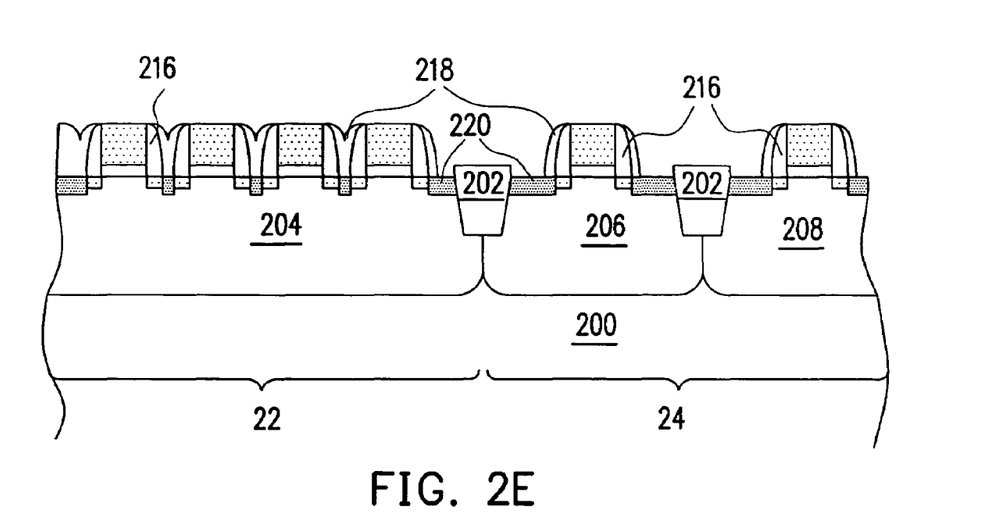

As shown in FIG. 2E, using the patterned gate conductive layer 212a and the sidewall spacers 216 as masks, source/drain (S/D) implantation is performed to form S/D regions 220 in the substrate 200 along both sides of the spacers 216. For example, P-type S/D impurities are implanted into the N-well using the P-doped gate conductive layer and the spacers thereon as masks and with the P-wells covered, and N-type S/D impurities are later implanted into the P-wells using the N-doped gate conductive layer and spacers thereon as masks and with the N-well covered. Therefore, the PMOS transistor(s) is formed in the N-well(s) of the periphery region, while the NMOS transistors are formed in the P-wells in the memory region and the periphery region. Additionally, auxiliary spacers 218 can be formed on the spacers 216 by forming another blanket layer of silicon oxide or silicon nitride (not shown) covering the substrate and then etching back until the gate conductive layer is exposed, for example. For the memory region 22 with a dense pattern, auxiliary spacers 218 may be formed between the adjacent spacers 216 and covering the S/D regions 220.

Figure 2F:
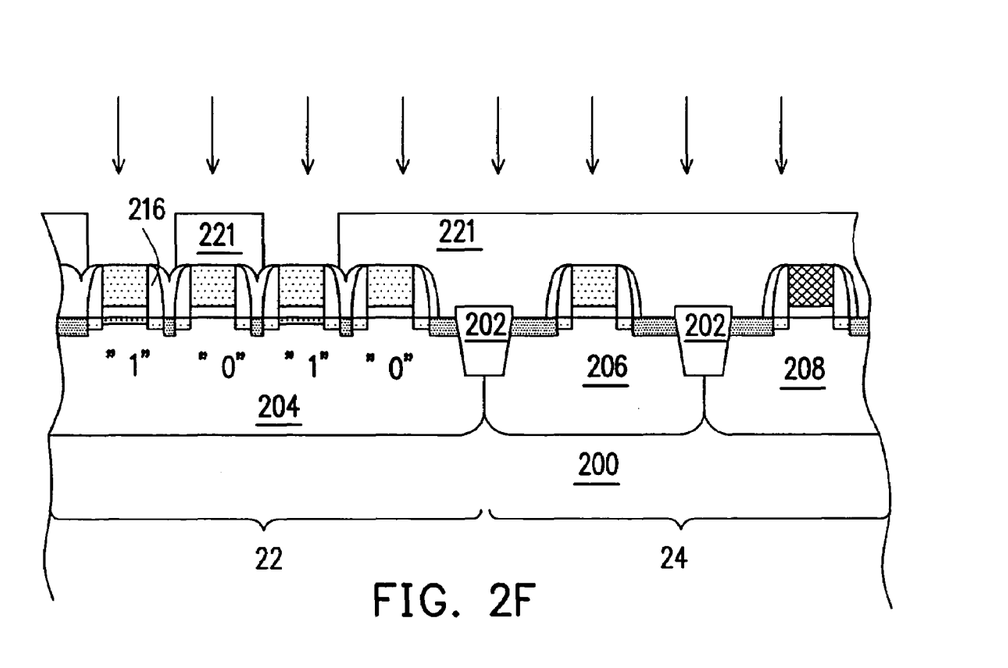

Referring to FIG. 2F, a third patterned photoresist layer 221 having a code-1 pattern is applied as a mask, and then the first code (code-1) implantation is performed to the memory region 22. For example, N-type impurities (such as, phosphorous) are implanted through the gate conductive layer 212a and the gate oxide layer 210 to the underlying channel regions of the substrate 200. The code-1 implanted channel regions are marked by dots (•) and the code-1 implanted memory cells (transistors) are marked with "1" in this figure.

Figure 2G:
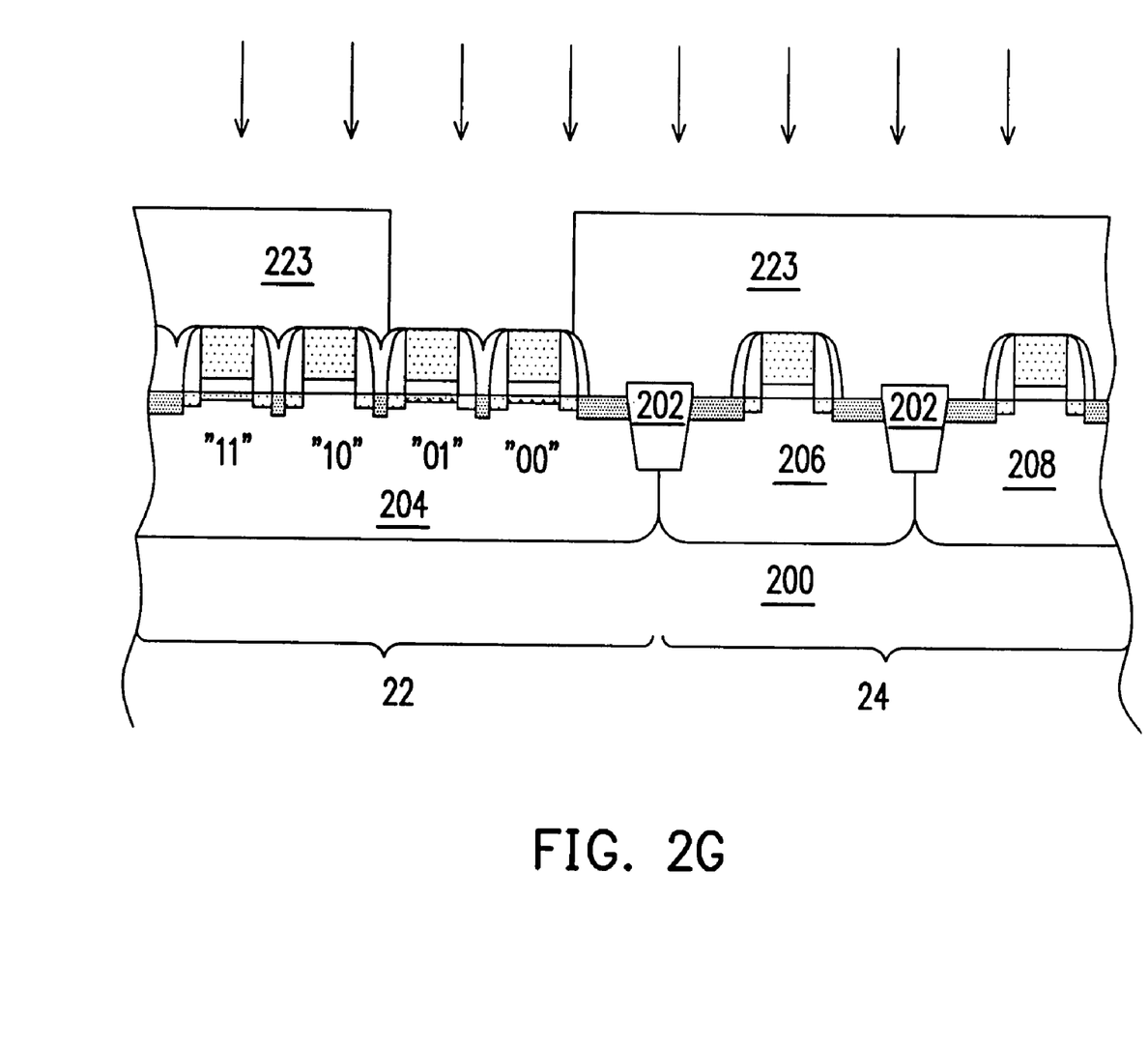

Referring to FIG. 2G, a fourth patterned photoresist layer 223 having a code-2 pattern is applied as a mask, and then the second code (code-2) implantation is performed to the memory region 22. For example, P-type impurities (such as, boron or $BF_2$) are implanted through the gate conductive layer 212a and the gate oxide layer 210 to the underlying channel regions of the substrate 200. The code-2 implanted channel regions are marked by crosses (x), and the code-2 implanted memory cells (transistors) are marked with "0" in this figure. As shown in FIG. 2G, the two-bit memory cells of the memory array includes four logic states "11", "10", "01" and "00" of two bits.

Figure 2H:
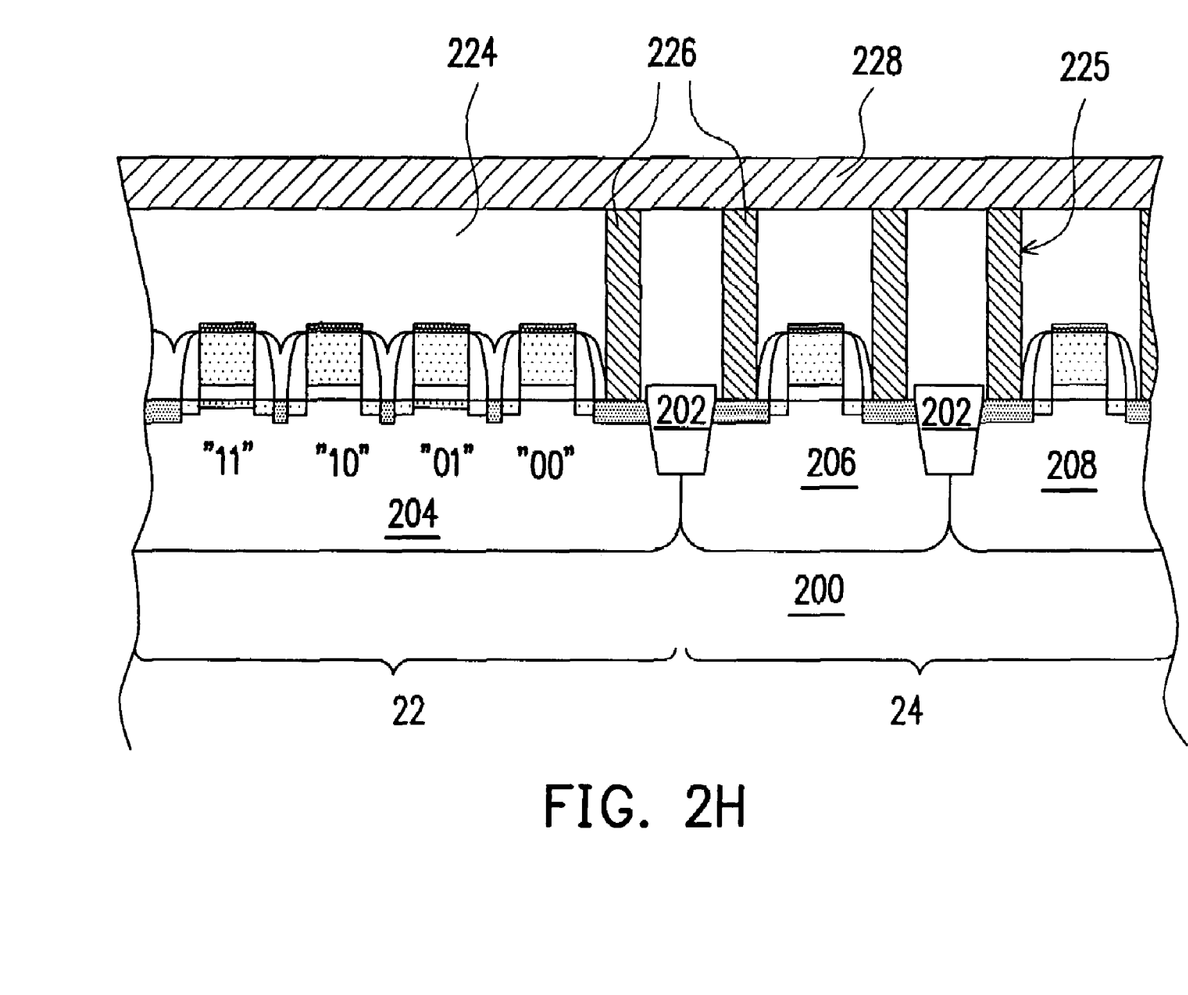

In FIG. 2H, after an interlayer dielectric (ILD) 224 is formed to cover the substrate 200 by deposition, contact holes 225 are formed in the ILD 224 and a barrier layer (not shown) is conformally formed to the contact holes 225. Then contact plugs 226 are formed within the contact holes 225 by, for example, depositing a tungsten layer (not shown) to fill the contact holes and then planarizing the tungsten layer. The contact plugs can be used to connect the word line to the bit line or other electrical sources. Subsequently, the back-end processes including the metallization process are performed. The metallization process comprises forming a metal layer 228 over the interlayer dielectric and then patterning the metal layer, for example.

As described above, each ROM memory cell can store two-bit data, and the memory array can provide four logic states of two bits.

Figure 3:
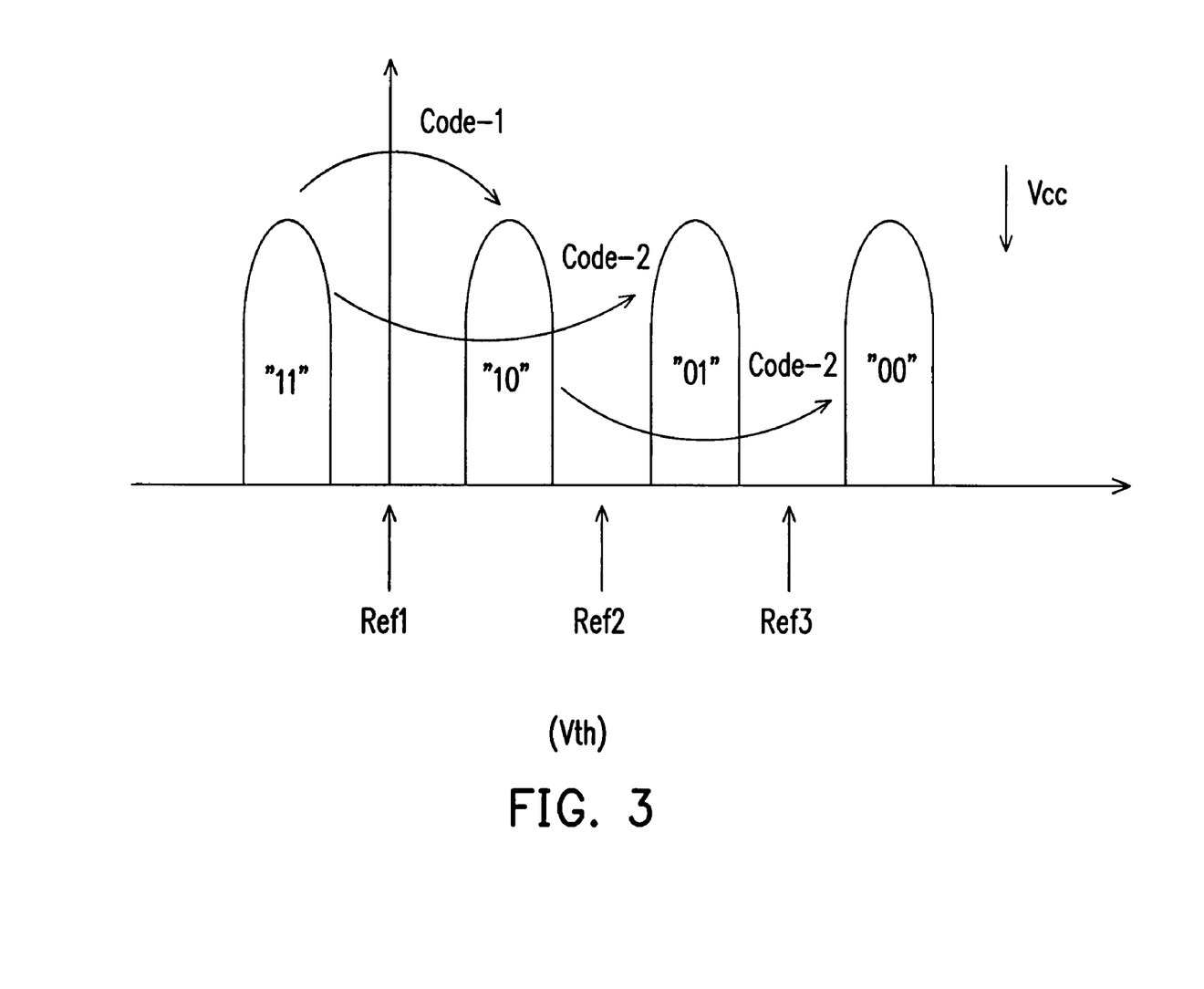
FIG. 3 is a schematic view showing the cell threshold voltage distribution of the ROM memory cell according to another preferred embodiment.

FIG. 3 is a schematic view showing the cell threshold voltage distribution of the ROM memory cell as the code implantation is applied to form a multi-level NAND ROM cell. According to this preferred embodiment, the intrinsic memory cell is a depletion mode transistor, for example, a NMOS transistor in P-type substrate having the threshold voltage (Vt) smaller than 0. For the memory cell, the "0" logic state of bit 1 stands for "yes" of the code-1 implantation (with impurities implanted to the cell), while the "1" logic state of bit 1 stands for "no" of the code-1 implantation (without impurities implanted to the cell), as shown in Table 2.

TABLE 2

Code-1, Code-2 implantation for the multi-level ROM cell (2 bits/cell).

|  | Implantation | Bit 2 (state) | Bit 1 (state) |
|---|---|---|---|
| Code-1 | Y | — | 0 |
|  | N | — | 1 |
| Code-2 | Y | 0 | — |
|  | N | 1 | — |

The "0" state of bit 1 for the memory cell can be achieved by performing the first cod (code-1) implantation, for example, implanting P-type impurities to the channel region, so that Vt of the doped memory cell is shift to a positive value. On the other hand, the memory cell without impurities implanted ("1" state of bit 1) still has Vt<0. In this case, the "0" logic state of bit 2 stands for "yes" of the code-2 implantation (with impurities implanted to the cell), while the "1" logic state of bit 2 stands for "no" of the code-2 implantation (without impurities implanted to the cell), as shown in Table 2. For example, the "0" state of bit 2 for the memory cell can be achieved by performing the second code (code-2) implantation, for example, implanting P-type impurities to the channel region, so that Vt of the memory cell shift to either a positive value or a higher value. As shown in FIG. 3, four sets of cell threshold distribution represent four logic states "11", "10", "01" and "00" of 2 bits in the ROM memory array. According to this embodiment, the code-1 implantation results in the memory cells with higher Vt (larger than 0 or Ref-1) and the memory cells with lower Vt (smaller than 0 or Ref-1). Then after the code-2 implantation, the memory cells with higher Vt that are implanted with code-2 impurities shift to even a higher Vt (higher than Ref-3), representing by the logic state "00", while the memory cells with lower Vt that are implanted with code-2 impurities shift to a higher Vt (higher than Ref-2), representing by the logic state "01". Similarly, after the code-2 implantation, the code-2-undoped memory cells with higher Vt and the code-2-undoped memory cells with lower Vt are respectively represented by the logic states "10" and "11". Ref-1, Ref-2 and Ref-3 are reference word line voltage to distinguish four logic states of the multi-level memory cell.

Figure 4A:
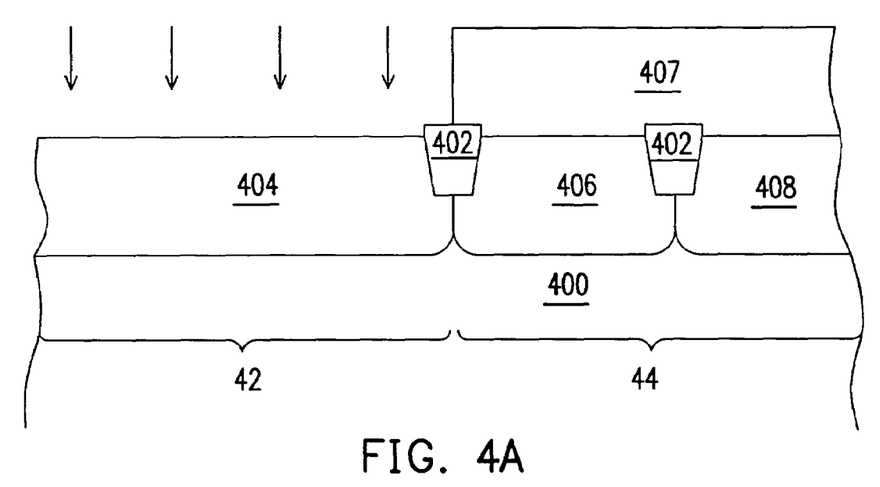
FIGS. 4A–4H are schematic cross-sectional views of process steps for forming the multilevel ROM memory cell according to another preferred embodiment of the present invention.

FIGS. 4A–4H are schematic cross-sectional views of process steps for forming the multilevel ROM memory cell according to another preferred embodiment of the present invention. In FIG. 4A, a substrate 400 having a plurality of isolation structures 402 is provided. The substrate 400 can be P-type substrate, and the isolation structure can be a shallow trench isolation (STI) structure, for example. The substrate 400 includes at least a memory region 42 and a periphery region 44. After well implantation and thermal treatment under 950–1100° C., a plurality of N-type wells (N-wells) and a plurality of P-type wells (P-wells) are formed in the substrate 400. The memory region 42 includes at least a P-type well 404, while the periphery region 44 includes at least a N-type well 406 and a P-type well 408. Then, after applying the first patterned photoresist layer 407 as a mask, N-type impurities are implanted (cell Vt implantation) to adjust the memory cell threshold voltage (Vt) in the memory region, so that the memory cell becomes the depletion mode NMOS transistor. In addition, P-type impurities can be implanted through the isolation structures as "channel stopper" to improve cell field isolation. Afterwards, the first patterned photoresist layer 407 is removed.

Figure 4B:
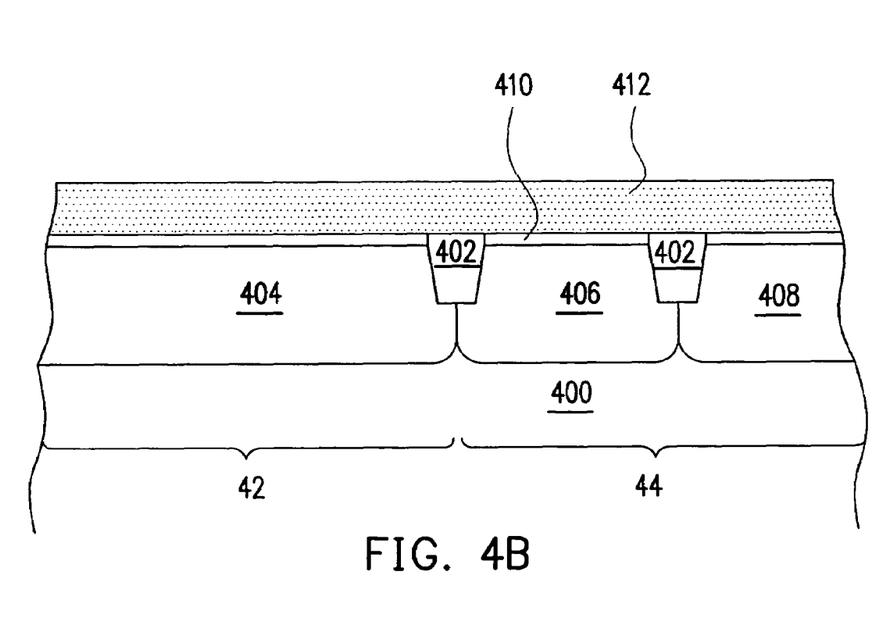

Referring to FIG. 4B, a gate oxide layer 410 and a gate conductive layer 412 are sequentially formed on the substrate 400. The gate conductive layer is, for example an undoped polysilicon layer having a thickness of about 2000–4000 Angstroms. If the gate conductive layer is an undoped polysilicon layer, N-type impurities are implanted into the undoped gate conductive layer above the P-wells, and P-type impurities are then implanted into the undoped gate conductive layer above the N-wells, by using different patterned photoresist masks. Alternatively, the gate conductive layer 412 can be a doped polysilicon layer formed by deposition with in-situ doping, for example.

Figure 4C:
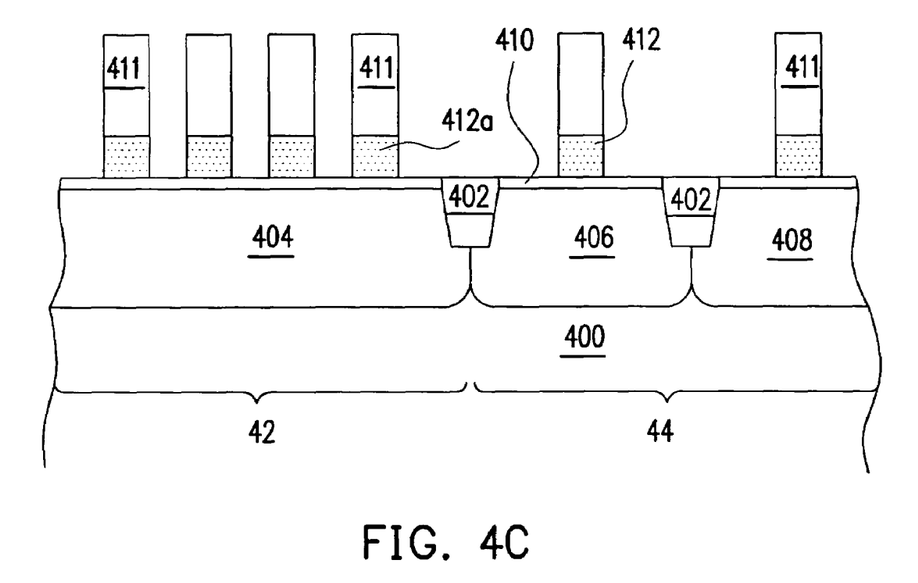

In FIG. 4C, after applying the second patterned photoresist layer 411 as a mask, the gate conductive layer 412 is patterned by, for example, performing dry etching. The patterned gate conductive layer 412a acts as word line(s) of the NAND type ROM cell.

Figure 4D:
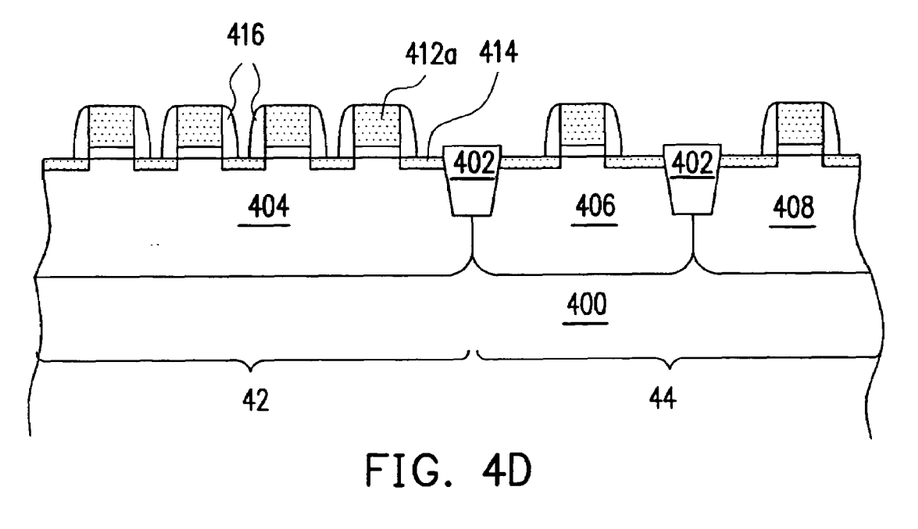

Referring to FIG. 4D, using the patterned gate conductive layer 412a as a mask, LDD implantation is performed to form LDD regions 414 in the substrate 400 along both sides of the patterned gate conductive layer 412a. For example, N-type LDD impurities are implanted into the P-wells using the N-doped gate conductive layer as masks and with the N-well covered, and P-type LDD impurities are later implanted into the N-well using the P-doped gate conductive layer as mask and with the P-wells covered. Afterwards, spacers 416 are formed on the sidewalls of the patterned gate conductive layer 412a, by, for example, blanketly forming a silicon oxide layer or a silicon nitride layer or both (not shown) covering the substrate and then etching back until the gate conductive layer is exposed.

Figure 4E:
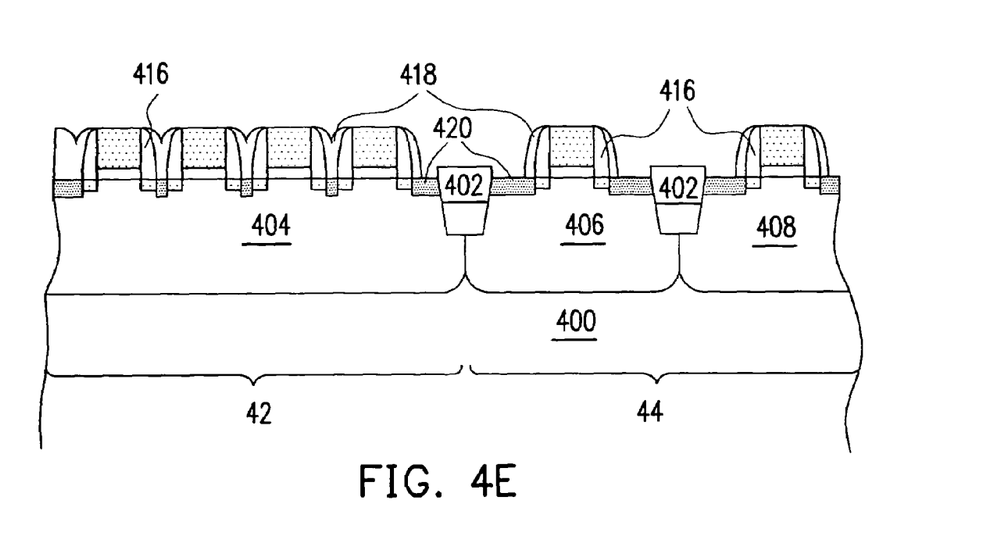

As shown in FIG. 4E, using the patterned gate conductive layer 412a and the sidewall spacers 416 as masks, source/drain (S/D) implantation is performed to form S/D regions 420 in the substrate 400 along both sides of the spacers 416. For example, P-type S/D impurities are implanted into the N-well using the P-doped gate conductive layer and the spacers thereon as masks and with the P-wells covered, and N-type S/D impurities are later implanted into the P-wells using the N-doped gate conductive layer and spacers thereon as masks and with the N-well covered. Therefore, the PMOS transistor(s) is formed in the N-well(s) of the periphery region, while the NMOS transistors are formed in the P-wells in the memory region and the periphery region. Additionally, auxiliary spacers 418 can be formed on the spacers 416 by forming another blanket layer of silicon oxide or silicon nitride (not shown) covering the substrate and then etching back until the gate conductive layer is exposed, for example. For the memory region 42 with a dense pattern, auxiliary spacers 418 may be formed between the adjacent spacers 416 and covering the S/D regions 420.

Figure 4F:
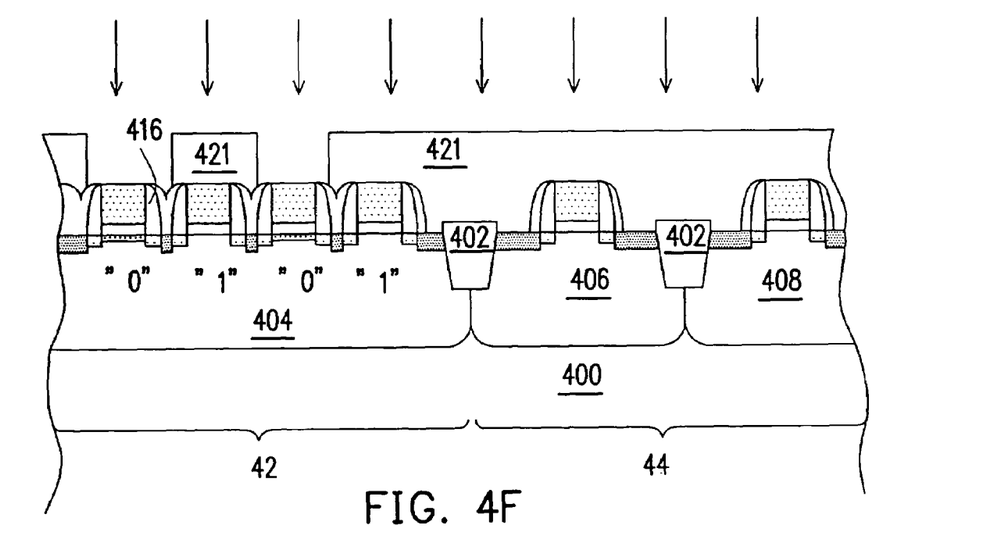

Referring to FIG. 4F, a third patterned photoresist layer 421 having a code-1 pattern is applied as a mask, and then the first code (code-1) implantation is performed to the memory region 42. For example, P-type impurities (such as, boron or $BF_2$) are implanted through the gate conductive layer 412a and the gate oxide layer 410 to the underlying channel regions of the substrate 400. The code-1 implanted channel regions are marked by dots (•), and the code-1 implanted memory cells (transistors) are marked with "0" in this figure.

Figure 4G:
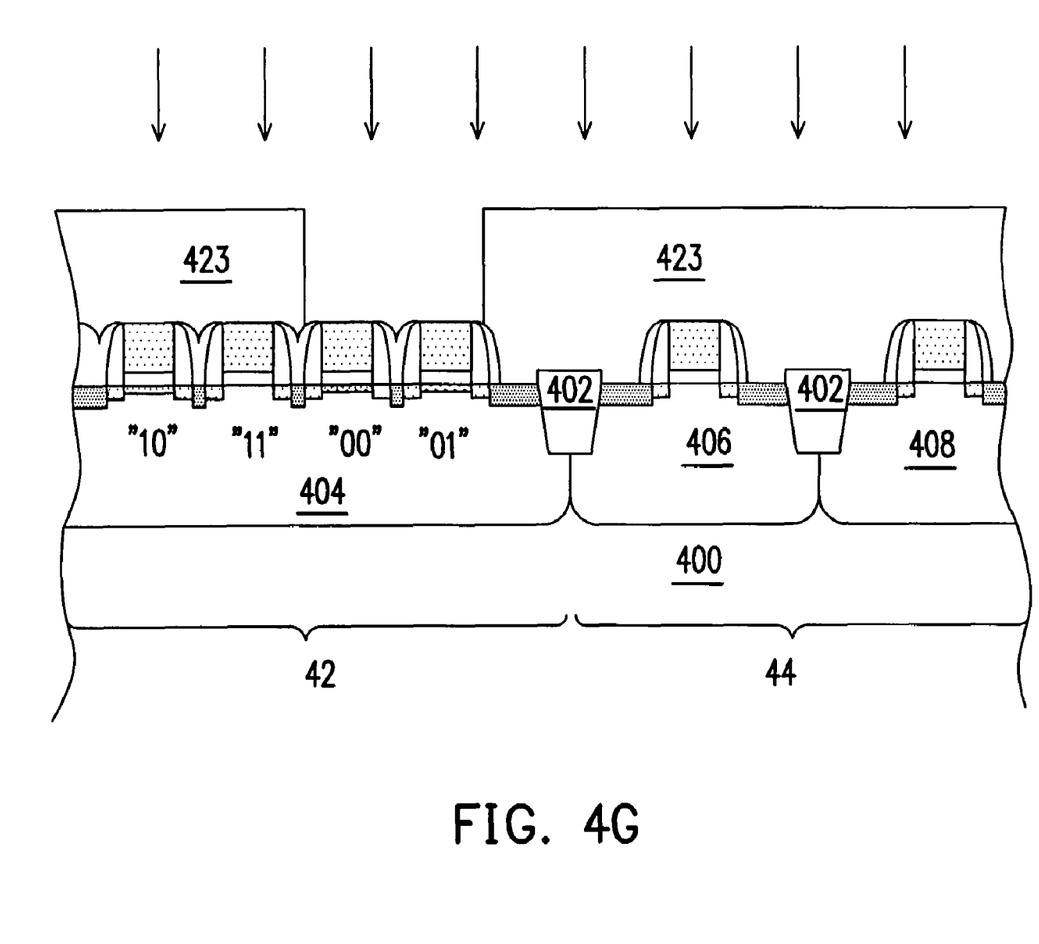

Referring to FIG. 4G, a fourth patterned photoresist layer 423 having a code-2 pattern is applied as a mask, and then the second code (code-2) implantation is performed to the memory region 42. For example, P-type impurities (such as, boron or $BF_2$) are implanted through the gate conductive layer 412a and the gate oxide layer 410 to the underlying channel regions of the substrate 400. The code-2 implanted channel regions are marked by crosses (x), and the code-2 implanted memory cells (transistors) are marked with "0" in this figure. As shown in FIG. 4G, the two-bit memory cells of the memory array includes four logic states "10", "11", "00" and "01" of two bits.

Figure 4H:
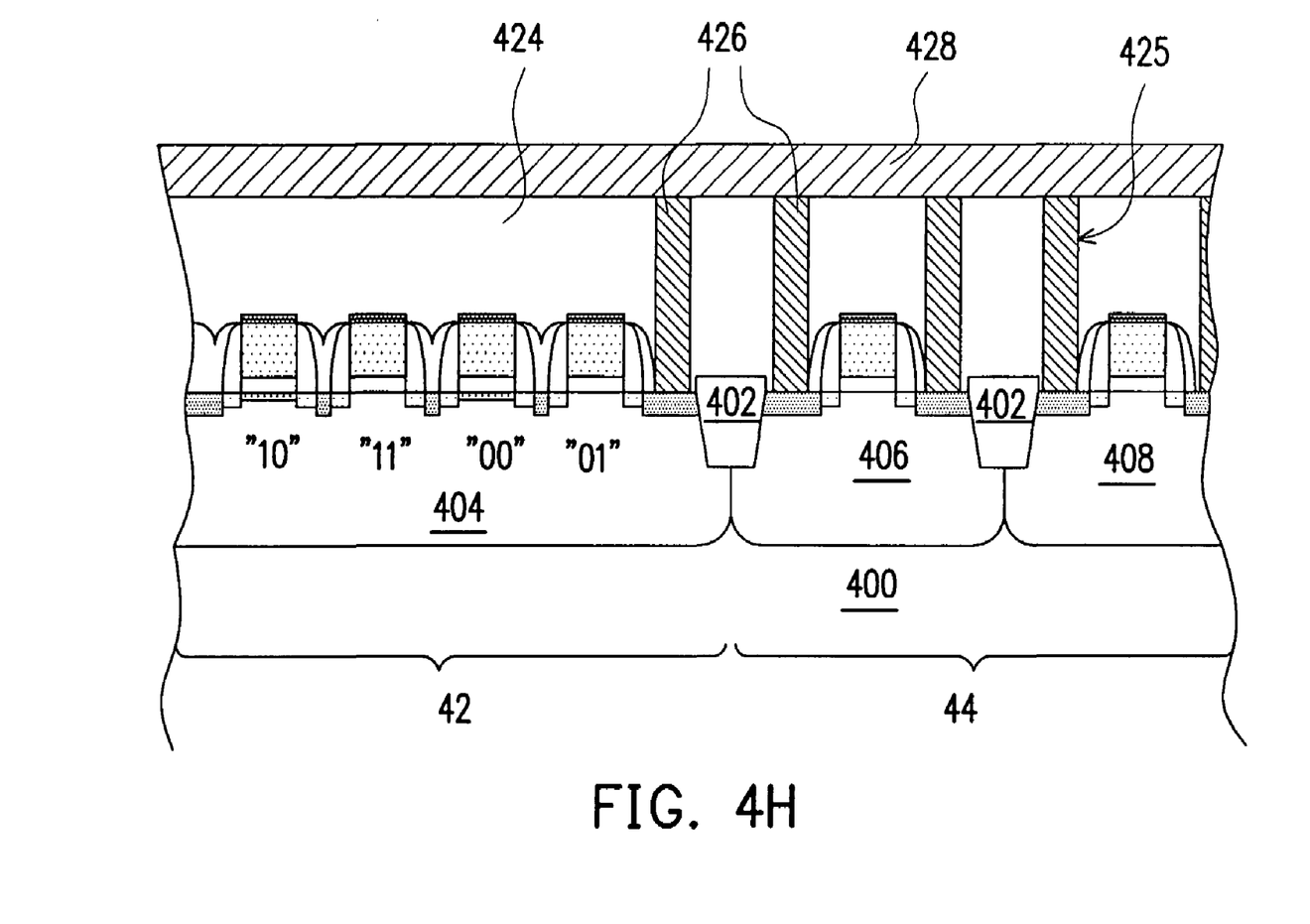

In FIG. 4H, after an interlayer dielectric (ILD) 424 is formed to cover the substrate 400 by deposition, contact holes 425 are formed in the ILD 424 and a barrier layer (not shown) is conformally formed to the contact holes 425. Then contact plugs 426 are formed within the contact holes 425 by, for example, depositing a tungsten layer (not shown) to fill the contact holes and planarizing the tungsten layer. The contact plugs can be used to connect the word line to the bit line or other electrical sources. Subsequently, the backend processes including the metallization process are performed. The metallization process comprises forming a metal layer 428 over the interlayer dielectric and then patterning the metal layer, for example.

As described above, each ROM memory cell can store two-bit data, and the memory array can provide four logic states of two bits.

For the NAND ROM memory consisting of the multi-level ROM memory cells provided by the present invention, an example of the read operation, as shown in Table 3, can be performed by the following steps: applying around 1V to the selected bit line (BL), grounding (GND) the source, biasing the unselected word lines (WL) to Vcc and biasing the selected WL to either Ref-1, Ref-2 or Ref-3, so as to distinguish four states of the multi-level memory cell.

TABLE 3

Device operation of the multi-level ROM memory cell.

| NODE | Read |
|---|---|
| BL | 1V |
| SGD | VCC |
| WL0 | VCC |
| WL1 | VCC |
| WL2 | VCC |
| WL3 | VCC |
| WL4 | VCC |
| WL5 (selected WL) | Ref-1, Ref-2, Ref-3 |
| WL6 | VCC |
| WL7 | VCC |
| VS | GND |
| P-WELL | GND |

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a mask read only memory structure, comprising:
   providing a substrate having a memory region and a periphery region;
   performing a threshold voltage implantation to adjust a threshold voltage of the memory region;
   forming a plurality of gate structures on the substrate, wherein the gate structure includes a gate oxide layer on the substrate and a gate conductive layer on the gate oxide layer;
   forming spacers on sidewalls of the gate structures;
   forming a plurality of source/drain regions in the substrate along both sides of the spacers;
   applying a first patterned photoresist layer with a first code pattern to the substrate and then performing a first code implantation to the memory region using the first patterned photoresist layer with the first code pattern as a mask;
   applying a second patterned photoresist layer with a second code pattern to the substrate and then performing a second code implantation to the memory region using the second patterned photoresist layer with the second code pattern as a mask;
   forming an interlayer over the substrate; and
   forming at least a contact plug in the interlayer.

2. The method of claim 1, wherein the substrate is a P type substrate and the step of performing the threshold voltage implantation comprises implanting P-type impurities to the memory region of the P type substrate.

3. The method of claim 2, wherein the threshold voltage is adjusted to be larger than 0 by the step of implanting P-type impurities to the memory region.

4. The method of claim 2, wherein the step of performing the first code implantation comprises implanting N-type impurities into channel regions of the gate structures that are not covered by the first patterned photoresist layer.

5. The method of claim 4, wherein the step of performing the second code implantation comprises implanting P-type impurities into channel regions of the gate structures that are not covered by the second patterned photoresist layer.

6. The method of claim 1, wherein the substrate is an N type substrate and the step of performing the threshold voltage implantation comprises implanting N-type impurities to the memory region of the N type substrate.

7. The method of claim 6, wherein the step of performing the first code implantation comprises implanting P-type impurities into channel regions of the gate structures that are not covered by the first patterned photoresist layer.

8. The method of claim 7, wherein the step of performing the second code implantation comprises implanting N-type impurities into channel regions of the gate structures that are not covered by the second patterned photoresist layer.

9. The method of claim 1, wherein the substrate is a P two substrate and the step of performing the threshold voltage implantation comprises implanting N-type impurities to the memory region of the P type substrate.

10. The method of claim 9, the threshold voltage is adjusted to be smaller than 0 by the step of implanting N-type impurities to the memory region.

11. The method of claim 9, wherein the step of performing the first code implantation comprises implanting P-type impurities into channel regions of the gate structures that are not covered by the first patterned photoresist layer.

12. The method of claim 11, wherein the step of performing the second code implantation comprises implanting P-type impurities into channel regions of the gate structures that are not covered by the second patterned photoresist layer.

13. The method of claim 1, wherein the substrate is an N type substrate and the step of performing the threshold voltage implantation comprises implanting P-type impurities to the memory region of the N type substrate.

14. The method of claim 13, wherein the step of performing the first code implantation comprises implanting N-type impurities into channel regions of the gate structures that are not covered by the first patterned photoresist layer.

15. The method of claim 14, wherein the step of performing the second code implantation comprises implanting N-type impurities into channel regions of the gate structures that are not covered by the second patterned photoresist layer.

16. The method of claim 1, further comprising forming a plurality of lightly doped drain (LDD) regions in the substrate along both sides of the gate structures before forming spacers on the sidewalls of the gate structures.

17. A method for forming a mask read only memory structure, comprising:
providing a substrate having a memory region and a periphery region;
performing a threshold voltage implantation to adjust a threshold voltage of the memory region;
forming a plurality of word lines on the substrate;
forming first spacers on sidewalls of the word lines;
forming a plurality of source/drain regions in the substrate along both sides of the first spacers;
performing a first code implantation to the memory region using a first patterned photoresist layer with a first code pattern as a mask, so as to obtain memory cells with a first threshold voltage range and memory cells with a second threshold voltage range; and
performing a second code implantation to the memory region using a second patterned photoresist layer with a second code pattern as a mask, so as to obtain memory cells with a third threshold voltage range and memory cells with a fourth threshold voltage range, in addition to the memory cells with the first threshold voltage and with the second threshold voltage range.

18. The method of claim 17, further comprising forming second spacers on the first spacers before performing the first code implantation, wherein the second spacers in the memory region are formed on and between the first spacers, so that the source/drain regions in the memory region are covered by the second spacers.

19. The method of claim 17, wherein the substrate is a P type substrate and the step of performing the threshold voltage implantation comprises implanting P-type impurities to the memory region of the P type substrate.

20. The method of claim 19, wherein the step of performing the first code implantation comprises implanting N-type impurities into channel regions of the word lines that are not covered by the first patterned photoresist layer.

21. The method of claim 20, wherein the step of performing the second code implantation comprises implanting P-type impurities into channel regions of the word lines that are not covered by the second patterned photoresist layer.

22. The method of claim 17, wherein the substrate is an N type substrate and the step of performing the threshold voltage implantation comprises implanting N-type impurities to the memory region of the N type substrate.

23. The method of claim 22, wherein the step of performing the first code implantation comprises implanting P-type impurities into channel regions of the word lines that are not covered by the first patterned photoresist layer.

24. The method of claim 23, wherein the step of performing the second code implantation comprises implanting N-type impurities into channel regions of the word lines that are not covered by the second patterned photoresist layer.

25. The method of claim 17, wherein the substrate is a P type substrate and the step of performing the threshold voltage implantation comprises implanting N-type impurities to the memory region of the P type substrate.

26. The method of claim 25, wherein the step of performing the first code implantation comprises implanting P-type impurities into channel regions of the word lines that are not covered by the first patterned photoresist layer.

27. The method of claim 26, wherein the step of performing the second code implantation comprises implanting P-type impurities into channel regions of the word lines that are not covered by the second patterned photoresist layer.

28. The method of claim 17, wherein the substrate is an N type substrate and the step of performing the threshold voltage implantation comprises implanting P-type impurities to the memory region of the N type substrate.

29. The method of claim 28, wherein the step of performing the first code implantation comprises implanting N-type impurities into channel regions of the word lines that are not covered by the first patterned photoresist layer.

30. The method of claim 29, wherein the step of performing the second code implantation comprises implanting N-type impurities into channel regions of the word lines that are not covered by the second patterned photoresist layer.

* * * * *